United States Patent
Midha et al.

(10) Patent No.: US 10,090,845 B1
(45) Date of Patent: Oct. 2, 2018

(54) FRACTION-N DIGITAL PLL CAPABLE OF CANCELING QUANTIZATION NOISE FROM SIGMA-DELTA MODULATOR

(71) Applicant: STMicroelectronics International N.V., Schiphol (NL)

(72) Inventors: Gagan Midha, Panipat (IN); Kallol Chatterjee, Gananagar (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

(21) Appl. No.: 15/471,483

(22) Filed: Mar. 28, 2017

(51) Int. Cl.
| H03L 7/08 | (2006.01) |
| H03L 7/06 | (2006.01) |
| H03L 7/093 | (2006.01) |
| H03M 3/00 | (2006.01) |
| H03L 7/081 | (2006.01) |

(52) U.S. Cl.
CPC .............. *H03L 7/093* (2013.01); *H03L 7/081* (2013.01); *H03L 7/0802* (2013.01); *H03M 3/322* (2013.01)

(58) Field of Classification Search
CPC ....... H03L 7/093; H03L 7/0802; H03L 7/081; H03M 3/322
See application file for complete search history.

(56) References Cited

U.S. PATENT DOCUMENTS

| 6,359,950 | B2 * | 3/2002 | Gossmann | H03L 7/07 327/156 |
| 6,943,600 | B2 * | 9/2005 | Craninckx | H03L 7/081 327/156 |
| 7,885,369 | B2 * | 2/2011 | Beyer | H03L 7/1976 327/153 |
| 8,497,716 | B2 * | 7/2013 | Zhang | H03L 7/1976 327/147 |
| 8,653,869 | B2 * | 2/2014 | Kao | H03L 7/1974 327/150 |
| 9,584,139 | B2 * | 2/2017 | Wicpalek | H03L 7/085 |

OTHER PUBLICATIONS

Borremans, Jonathan, et al: "A 86 MHz-12 GHz Digital-Intensive PLL for Software-Defined Radios, Using a 6 fJ/Step TDC in 40 nm Digital CMOS," IEEE Journal of Solid-State Circuits, vol. 45, No. 10, Oct. 2010 (pp. 2116-2129).

(Continued)

*Primary Examiner* — Kenneth B Wells
(74) *Attorney, Agent, or Firm* — Crowe & Dunlevy

(57) ABSTRACT

A phase locked loop (PLL) circuit disclosed herein includes a phase detector receiving a reference frequency signal and a feedback frequency signal and configured to output a digital signal indicative of a phase difference between the reference frequency signal and the feedback frequency signal. A digital loop filter filters the digital signal. A digital to analog converter converts the filtered digital signal to a control signal. An oscillator generates a PLL clock signal based on the control signal. A sigma-delta modulator modulates a divider signal as a function of a frequency control word. A divider divides the PLL clock signal based on the divider signal, and generates a noisy feedback frequency signal based thereupon. A noise filtering block removes quantization noise from the noisy feedback frequency signal to thereby generate the feedback frequency signal.

21 Claims, 3 Drawing Sheets

(56) References Cited

OTHER PUBLICATIONS

Da Dalt, Nicola: "Linearized Analysis of a Digital Bang-Bang PLL and Its Validity Limits Applied to Jitter Transfer and Jitter Generation," IEEE Transactions on Circuits nad Systems—I: Regular Papers, vol. 55, No. 11, Dec. 2008 (pp. 3663-3675).

Da Dalt, Nicola: "Markov Chains-Based Derivation of the Phase Detector Gain in Bang-Bang PLLs," IEEE Transactions on Circuits and Systems, II: Express Briefs, vol. 53, No. 11, Nov. 2006, pp. 1195-1199).

Grollitsch, Werner, et al: "A 1.4ps(rms)-Period-Jitter TDC-Less Fractional-N Digital PLL with Digitally Controlled Ring Oscillator in 65nm CMOS," 2010 IEEE International Solid-State Circuits Conference, pp. 478-480.

Hsu, Chun-Ming, et al: "A Low-Noise Wide-BW 3.6-GHz Digital S? Fractional-N Frequency Synthesizer With a Noise-Shaping Time-to-Digital Converter and Quantization Noise Cancellation," IEEE Journal of Solid-State Circuits, vol. 43, No. 12, Dec. 2008 (pp. 2776-2786).

Hsu, Chun-Ming, et al: "A Low-Noise, Wide-BW 3.6GHz Digital ?S Fractional-N Frequency Synthesizer with a Noise-Shaping Time-to-Digital Converter and Quantization Noise Cancellation," ISSCC 2008, Session 19, PLLs and Oscillators, 19.1, 2008 (3 pages).

Huang, Jhin-Fang, et al.: "Chip design of a 5.8-GHz fractional-N frequency synthesizer with a tunable Gm-C loop filter," Chin. Phys. B, vol. 21, No. 8 (2012), (8 pages).

Jian, Heng-Yu, et al.: "A Fractional-PLL for Multiband (0.8-6 GHz) Communications Using Binary-Weighted D/A Differentiator and Offset-Frequency ?-S Modulator", IEEE Journal of Solid-State Circuits, vol. 45, Apr. 2010 (pp. 768-780).

Liu, Jenlung, et al: "A 0.012mm2 3.1mW Bang-Bang Digital Fractional-N PLL with a Power-Supply-Noise Cancellation Technique and a Walking-One-Phase-Selection Fractional Frequency Divider," ISSCC 2014, Session 15, Digital PLLs, 15.2, 2014 (3 pages).

Nonis, Roberto, et al: "A 2.4psrms-jitter Digital PLL with Multi-Output Bang-Bang Phase Detector and Phase-Interpolator-Based Fractional-N Divider," ISSCC 2013, Session 20, Frequency Generation, 20.6, 2013 (3 pages).

Temporiti, Enrico, et al: "A 700-kHz Bandwidth S? Fractional Synthesizer With Spurs Compensation and Linearization Techniques for WCDMA Applications," IEEE Journal of Solid-State Circuits, vol. 39, No. 9, Sep. 2004 (pp. 1446-1454).

Ti, Ching-Lung, et al.: "A 2.4GHz Fractional-N PLL with PFD/CP Linearization and an Improved CP Circuit," IEEE International Symposium on Circuits and Systems, 2008 (4 pages).

Weltin-Wu, Colin, et al: "A 3GHz Fractional-N All-Digital PLL with Precise Time-to-Digital Converter Calibration and Mismatch Correction," 2008 IEEE International Solid-State Circuits Conference, pp. 344, 345, 618.

Zhao, F, et al.: "Low-Noise Low-Power Design for Phase Locked loops," Chapter 2, 2015 (13 pages).

* cited by examiner

FRACTION-N DIGITAL PLL CAPABLE OF CANCELING QUANTIZATION NOISE FROM SIGMA-DELTA MODULATOR

TECHNICAL FIELD

This disclosure relates to locked loop circuits such as, for example, a fractional-N/integer-N phase locked loop (PLL) or a frequency locked loop (FLL) circuit, and, in particular, to techniques for canceling quantization noise induced by sigma-delta modulation of a divider in the locked loop.

BACKGROUND

Locked loop circuits, such as phase locked loop circuits, are basic components of radio, wireless, and telecommunication technologies. A phase locked loop or phase lock loop (PLL) is a control system that generates an output signal having a phase related to the phase of an input signal. A simple PLL includes a variable frequency oscillator and a phase detector. The oscillator generates a periodic signal, and the phase detector compares the phase of that signal with the phase of a reference periodic signal, adjusting the oscillator to keep the phases matched. Keeping the input and output phase in lock step also implies keeping the input and output frequencies the same. Consequently, in addition to synchronizing signals, a PLL can track an input frequency, or it can generate a frequency that is a multiple (or fraction) of the input frequency.

PLL circuits can be implemented in either analog only technology, or with digital components. By using digital components, the area consumed by a PLL can be reduced, lock time can be decreased, and programmability of the PLL for use at different frequencies can be easily implemented.

With reference to FIG. 1, a typical PLL 20 is now described. The PLL 20 receives a reference frequency signal Fref that is fed to a first input of a phase difference detector 22, which is illustratively a time to digital converter (TDC) phase detector. A second input of the TDC 22 receives a feedback frequency signal Fdiv. The TDC 22 determines a difference in phase between the reference frequency signal Fref and the feedback frequency signal Fdiv and outputs a digital signal Ddif indicative of that measured difference. A subtractor 24 receives the digital signal Ddif and subtracts from it the quantization noise Qnoise. The output from subtractor 24 is filtered by digital filter 26, which generates a control signal Dcont.

A digital-to-analog converter (DAC) circuit 28 converts the digital control signal Dcont to an analog control signal Acont. A control input of an oscillator circuit 18, which is illustratively a current controlled oscillator (CCO), receives the analog control signal Acont and generates an output clock signal Fcco having a frequency that is dependent on the magnitude of the analog control signal Acont. A divider circuit (/N) 32 divides the output clock signal Fcco by N to generate the feedback frequency signal Fdiv which is compared to the reference frequency signal Fref to control loop operation. When Fref matches Fdiv, the PLL 20 is said to have "locked".

A sigma-delta modulator (SDM) 34 quantizes a frequency control word FCW to generate a control signal S for the divider circuit 32. The control signal S modulates the divider circuit 32 during operation to thereby cause a frequency of the output clock signal to be a fractional multiple of the reference frequency signal Fref.

The frequency control word FCW is subtracted from the output S of the SDM 34 by subtractor 36 to produce a raw error signal E, representing the quantization noise introduced by the quantization of the frequency control word FCW. The raw error signal E is accumulated by accumulator 38 to produce the quantization noise signal Qnoise, which, as stated above, is subtracted from the digital signal Ddif indicative of the measured difference in phase between the reference signal Fref and feedback signal Fdiv.

While this implementation provides for a digitally implemented fractional-N PLL, power consumption of the design may be undesirably high due to the TDC 22, and fractional spurs may be generated, leading to undesirable performance when generating certain frequencies of signal.

Therefore, further development of digital PLL circuits is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A phase locked loop (PLL) circuit disclosed herein includes a phase detector receiving a reference frequency signal and a feedback frequency signal and configured to output a digital signal indicative of a phase difference between the reference frequency signal and the feedback frequency signal. A digital loop filter filters the digital signal. A digital to analog converter converts the filtered digital signal to a control signal. An oscillator generates a PLL clock signal based on the control signal. A sigma-delta modulator modulates a divider signal as a function of a frequency control word. A divider divides the PLL clock signal based on the divider signal, and generates a noisy feedback frequency signal based thereupon. A noise filtering block removes quantization noise from the noisy feedback frequency signal to thereby generate the feedback frequency signal.

The noise filtering block may include a delay chain configured to generate multiple different delayed versions of the noisy feedback frequency signal, and a multiplexer configured to receive the multiple different delayed versions of the noisy feedback frequency signal as input and to pass one of the multiple different delayed versions of the noisy feedback frequency signal to the phase detector as the feedback frequency signal as a function of the quantization noise.

The delay chain may include a plurality of series connected buffers each having a constant delay. The delay chain and multiplexer may cooperate to adjust a phase of the noisy feedback frequency signal to remove the quantization noise therefrom.

A control circuit may be configured to receive an unshaped quantization error from the sigma-delta modulator and to generate a control signal for the multiplexer based thereupon. The control circuit may generate the control signal by quantizing the unshaped quantization error from a higher bit count to a lower bit count to produce a first intermediate signal, applying a noise transfer function to the first intermediate signal to produce a second intermediate signal, and integrating the second intermediate signal to produce the control signal. The control circuit may multiply the unshaped quantization error by a scaling factor prior to the quantizing.

A scaling factor circuit may be configured to calculate a number of delay elements of the delay chain needed to delay the noisy feedback frequency signal by a period of the PLL clock signal, and to generate the scaling factor based upon the number.

The delay chain may include a plurality of series connected buffers, with one of the multiple different delayed versions of the noisy feedback frequency signal being produced at an output of each of the plurality of series connected buffers. The scaling factor circuit may include a plurality of flip flops, each having an input coupled to an output of a different one of the plurality of series connected buffers, and being clocked by a delayed version of the noisy feedback frequency signal. A binary encoder may receive output from each of the plurality of flip flops and may be configured to calculate the number of delay elements of the delay chain needed to delay the noisy feedback frequency signal by a period of the PLL clock signal based upon the output from each of the plurality of flip flops, and to generate the scaling factor based upon the number divided by a number of bits in the frequency control word.

A delay flip flop may receive the noisy feedback frequency signal as input, be clocked by the PLL clock signal, and generate the delayed version of the noisy feedback frequency signal as output.

The scaling factor circuit may be activated to calculate the scaling factor once after phases of the reference frequency signal and the feedback frequency signal are matched. The scaling factor circuit may operate to continuously recalculate the scaling factor after phases of the reference frequency signal and the feedback frequency signal are matched.

In some cases, the phase detector may be a bang-bang phase detector. The oscillator may be a current controlled oscillator.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
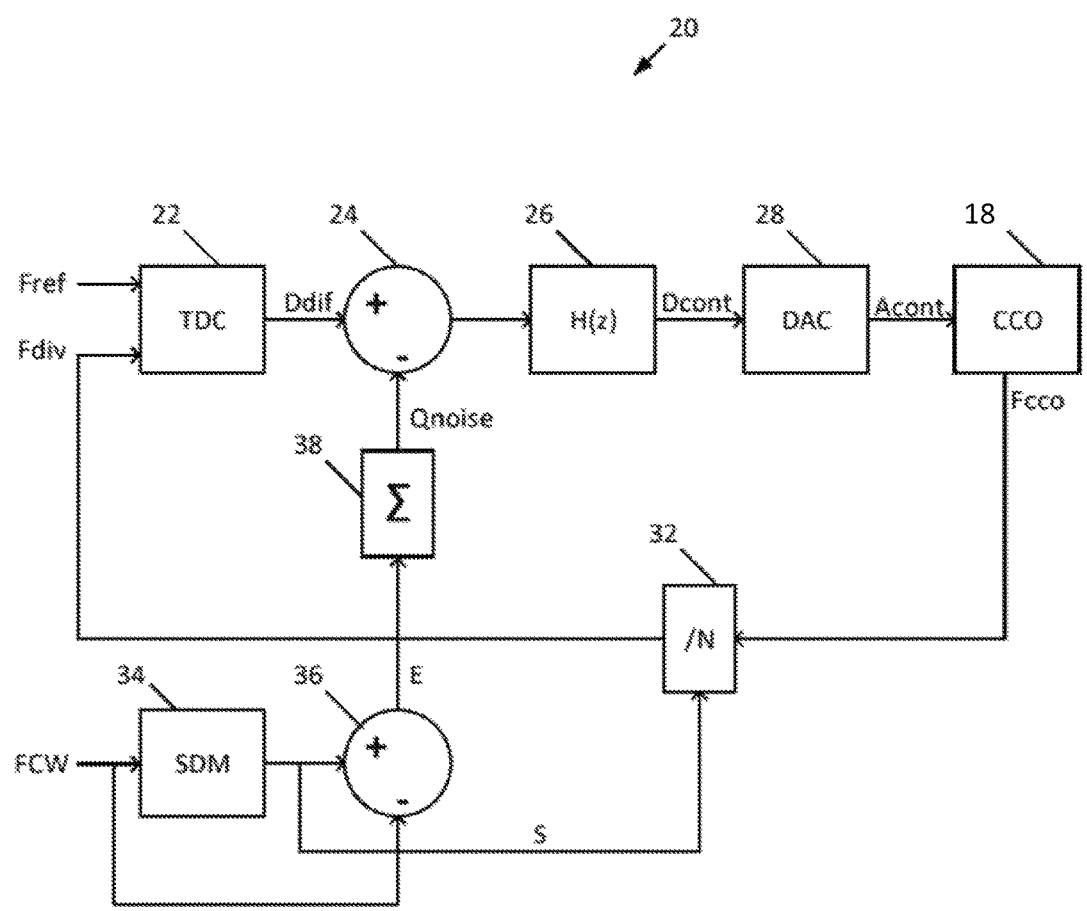
FIG. 1 is a schematic block diagram of a prior art digital fractional-N phase locked loop circuit.
Figure 2:
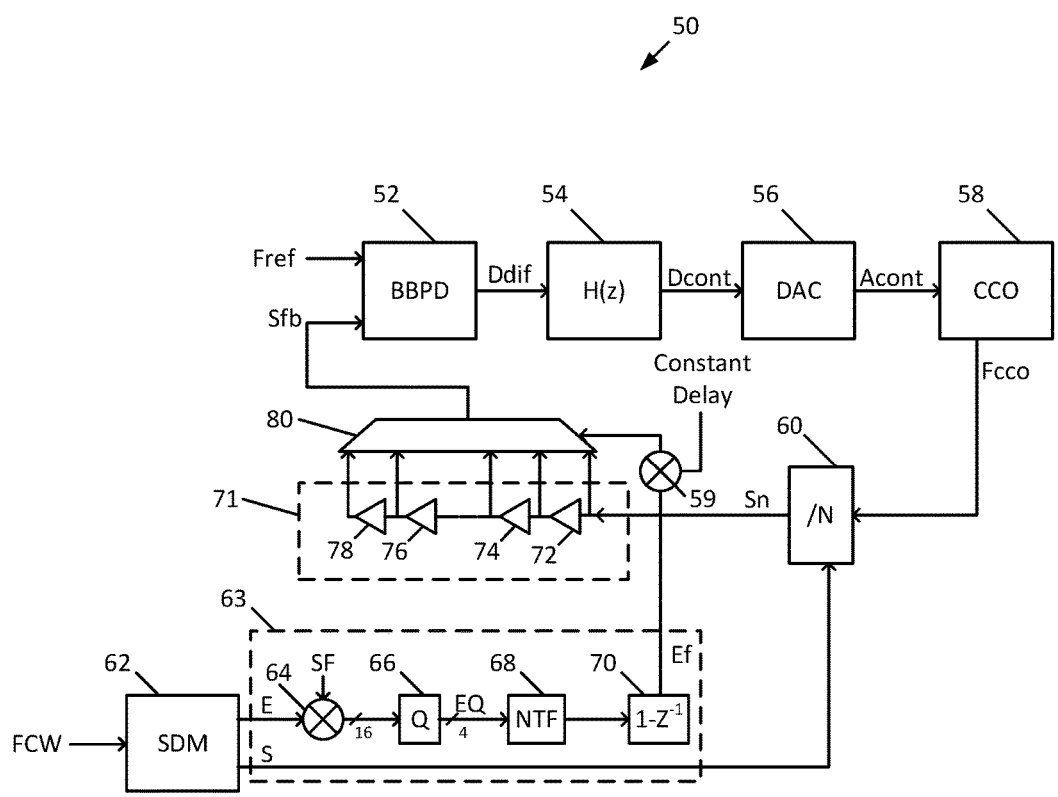
FIG. 2 is a schematic block diagram of a digital fractional-N phase locked loop circuit in accordance with this disclosure.

With reference to FIG. 2, a digital fractional-N/integer-N phase locked loop 50 is now described. The phase locked loop 50 includes a phase difference detector 52, which, as shown, may be a bang-bang phase detector (BBPD). The BBPD 52 receives as input a reference frequency signal Fref and a feedback signal Sfb. The BBPD 52 determines a difference in phase between the reference frequency signal Fref and the feedback frequency signal Sfb and outputs a digital signal Ddif indicative of that measured difference.

The digital signal Ddif is filtered by digital filter 54, such as a low pass digital filter, which generates a control signal Dcont.

A digital-to-analog converter (DAC) 56 converts the digital control signal Dcont to an analog control signal Acont. A control input of an oscillator circuit 58, which is illustratively a current controlled oscillator (CCO), receives the analog control signal Acont and generates an output clock signal Fcco having a frequency Fco that is dependent on the magnitude of the analog control signal Acont. A divider circuit (/N) 60 divides the output clock signal Fcco by N to generate a signal Sn.

The divider circuit 60 is modulated and controlled by a control signal S generated by sigma-delta modulator (SDM) 62. Sigma-delta modulator 62 quantizes a K bit (16 bit, for example) fractional frequency control word FCW into a multilevel integer control signal S for the divider circuit 60 such that the quantization error is high pass shaped. The integer divider 60 is modulated by the control signal S to cause the fractional divide. Other bit frequency control words may be used, and may be quantized into other numbers of bits for the control signal.

The control signal S can be represented as S=FCW+E*NTF, where E represents the unshaped quantization error or noise introduced by the sigma-delta modulator 62, and where NTF represents the noise transfer function of the sigma-delta modulator 62.

The output Sn produced by the divider circuit 60, which is a feedback frequency signal that contains quantization noise from the sigma-delta modulator 62, can be represented as $$Sn = S * \frac{1}{1-z^{-1}}.$$

Since S undergoes a frequency to phase conversion through the divider circuit 60, Sn represents the phase input to the PLL after the divider circuit 60.

Cancellation of the quantization noise from the signal Sn will now be discussed. Control circuitry 63 includes a multiplier 64 which receives the unshaped quantization error E from the sigma-delta modulator 62 and multiplies it by a scaling factor SF (which will be described below). The unshaped quantization error E is still sixteen bits in length as a 16 bit fractional resolution for FCW is chosen. To cancel this quantization error, the signal E is quantized to K bits (for example, to a target of 4 bits or 24 db noise improvement over E) by quantizing block 66 to produce signal EQ. Q represents the quantization error added in the quantization process and can be represented as Q=E/16. EQ can be represented as EQ=E+Q.

The resulting signal EQ is passed through the noise transfer function block 68 and integrator 70. This produces the control signal Ef as $$Ef = EQ * NTF * \frac{1}{1-z^{-1}}.$$

The goal is therefore to subtract Ef from Sn to produce the feedback signal Sf. Mathematically, this can be represented as:

$$Sfb = Sn - Ef = FCW * \frac{1}{1-z^{-1}} + Q * NTF * \frac{1}{1-z^{-1}}.$$

Since the desired signal Sfb is $$FCW * \frac{1}{1-z^{-1}},$$

the phase error introduced in the loop is $$Q * NTF * \frac{1}{1-z^{-1}}.$$

Without this quantization error cancellation being performed, the phase error introduced would instead be $$E * NTF * \frac{1}{1-z^{-1}},$$

meaning that the quantization error cancellation reduces the phase error by 1/16.

To implement this goal of subtracting quantization error Ef from Sn, delay chain 71 is used. Delay chain 71 is comprised of multiple buffers 72, 74, 76, 78 coupled in series to the output signal Sn of the divider circuit 60, and outputs multiple different delayed versions of Sn to multiplexer 80, with each delayed version of Sn having a different delay than others. The multiplexer 80 is controlled by the control signal Ef, which is generated by control circuitry 63. This serves to cancel out the quantization error E and what remains is Q shaped by NTF 68 and integrator function 70. A constant delay (CD) is introduced at summer 59 and kept, so that the phase can be delayed (if Ef is positive) and advanced (if Ef is negative). CD can be half of the total delay elements and Ef is added to it to form the control signal to the multiplexer 80. For example 64 delay elements are used, then the control signal will be (32+Ef), under the assumption that Ef would be in the range of +32 to −32. This works well for a second order MASH 1-1 modulator as the NTF is $(1-z-1)^2$. The phase excursion due to E after the integrating function of 1/(1-z-1) will be 1*Tvco, i.e +16 to −16 delay elements for each buffer delay of Tcco/16. So, the total delay elements to be used are 32. As the delay will change with temperature, 64 delay elements may be chosen to provide for a comfortable margin.

The buffers 72, 74, 76, 78 may each introduce a same amount of delay.

Figure 3:
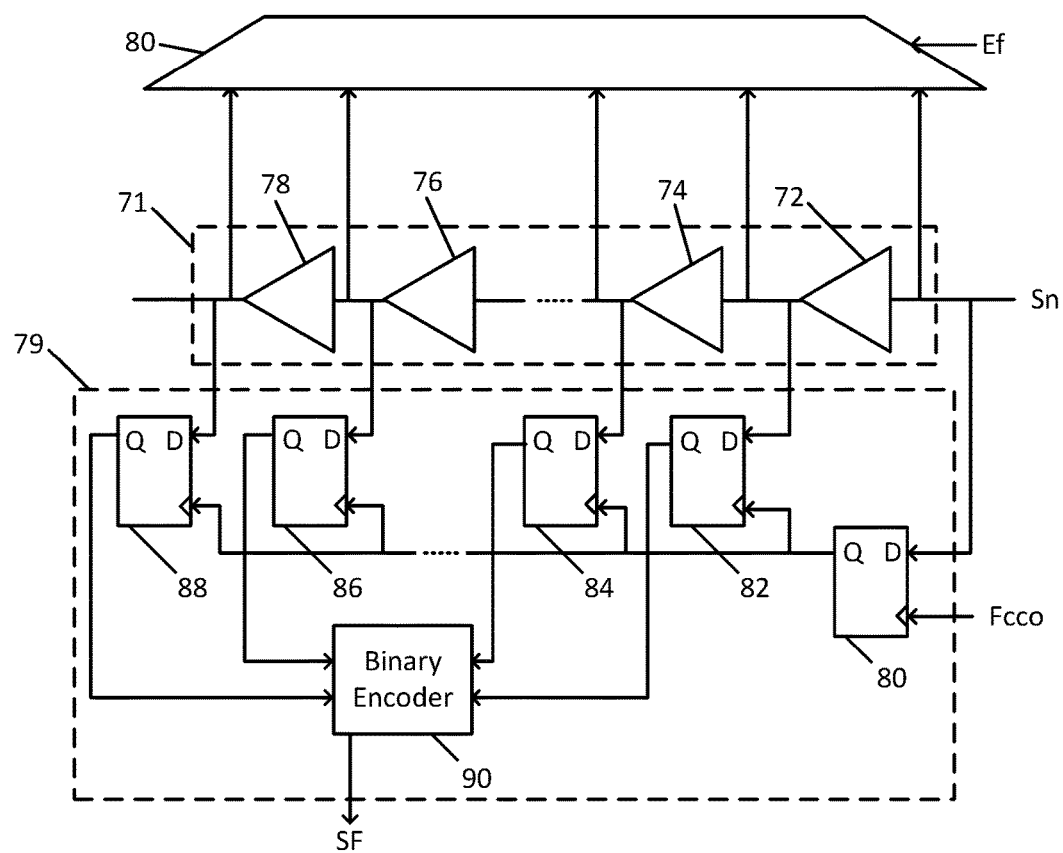
FIG. 3 is a schematic block diagram of a scaling factor circuit for use with the digital fractional-N phase locked loop circuit of FIG. 2.

In the case where the delay of each buffer is equal to Tcco/16, where Tcco represents the period of Fcco, additional circuitry beyond the delay chain 71 and multiplexer 80 is not needed. However, so as to preserve programmability of the PLL 50, in some cases, scaling circuitry 79 (shown in FIG. 3) may be used to calculate how many of the buffers 72, 74, 76, 78 are needed to have a delay equal to Tcco. In some cases, the delay of the buffers 72, 74, 76, 78 may vary with temperature, and thus the scaling circuitry 79 may change the number of buffers 72, 74, 76, 78 which are activated in order to perform the necessary compensation.

The scaling circuitry 79 includes a clock flip flop 80 receiving Sn at its D input, being clocked by Fcco, and providing output that clocks flip flops 82, 84, 86, 88. Thus, the clock flip flop 80 delays Sn by one period of Fcco. Flip flop 82 has its D input coupled to the output of buffer 72, flip flop 84 has its D input coupled to the output of buffer 74, flip flop 86 has its D input coupled to the output of buffer 76, and flip flop 88 has its D input coupled to the output of buffer 78.

The Q outputs of flip flops 82, 84, 86, and 88 are fed to binary encoder 90, which generates the scaling factor SF therefrom. The scaling factor SF is calculated as the number of delay elements equal to the period of Fcco, denoted as NB, divided by the number of bits of the frequency control word FCW. Thus, here, SF can be calculated as SF=NB/16.

In some cases, the binary encoder 90 activates, performing a thermometric to binary conversion to calculate the scaling factor SF once after the PLL 50 has locked. In other cases, the binary encoder 90 may operate continuously. In yet others, the binary encoder 90 may be activated infrequently, to adjust for variation in the delay provided by the buffers 72, 74, 76, 78 due to temperature variation. This activation of the binary encoder 90 may be once every 10 ms, for example.

It should be noted that where the implementation is such that the scaling circuitry 79 is used, the noise reduction depends on NB. If NB is equal to 14, then E/Q becomes 14.

It should be appreciated that the sigma-delta modulator 34 need not operate to modulate the divider circuit 60, and that the PLL 50 may thus operate in an integer divide mode instead of in a fractional divide mode. Of note is that, due to the novel design of the PLL 50, power consumption in fractional divide mode is not higher than in integer divide mode. Therefore, the PLL 50 not only has low noise, but also has low power consumption.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A phase locked loop (PLL) circuit, comprising:
a phase detector receiving a reference frequency signal and a feedback frequency signal and configured to output a digital signal indicative of a phase difference between the reference frequency signal and the feedback frequency signal;
a digital loop filter configured to filter the digital signal;
a digital to analog converter configured to convert the filtered digital signal to a control signal;
an oscillator configured to generate a PLL clock signal based on the control signal;
a sigma-delta modulator configured to modulate a divider signal as a function of a frequency control word;
a divider configured to divide the PLL clock signal based on the divider signal, and to generate a noisy feedback frequency signal based thereupon; and
a noise filtering block configured to remove quantization noise from the noisy feedback frequency signal to thereby generate the feedback frequency signal, wherein the noise filtering block comprises:
a delay chain configured to generate multiple different delayed versions of the noisy feedback frequency signal, and
a multiplexer configured to receive the multiple different delayed versions of the noisy feedback frequency signal as input and to pass one of the multiple different delayed versions of the noisy feedback frequency signal to the phase detector as the feedback frequency signal as a function of the quantization noise; and a control circuit configured to receive an unshaped quantization error from the sigma-delta modulator and to generate a multiplexer control signal for the multiplexer based thereupon.

2. The PLL circuit of claim 1, wherein the delay chain comprises a plurality of series connected buffers each having a constant delay.

3. The PLL circuit of claim 1, wherein the delay chain and multiplexer cooperate to adjust a phase of the noisy feedback frequency signal to remove the quantization noise therefrom.

4. The PLL circuit of claim 1, wherein the control circuit generates the multiplexer control signal by:
quantizing the unshaped quantization error from a higher bit count to a lower bit count to produce a first intermediate signal;
applying a noise transfer function to the first intermediate signal to produce a second intermediate signal; and
integrating the second intermediate signal to produce the multiplexer control signal.

5. The PLL circuit of claim 4, wherein the control circuit multiplies the unshaped quantization error by a scaling factor prior to the quantizing.

6. The PLL circuit of claim 5, further comprising a scaling factor circuit configured to calculate a number of delay elements of the delay chain needed to delay the noisy feedback frequency signal by a period of the PLL clock signal, and to generate the scaling factor based upon the number.

7. The PLL circuit of claim 6, wherein the delay chain is comprised of a plurality of series connected buffers, with one of the multiple different delayed versions of the noisy feedback frequency signal being produced at an output of each of the plurality of series connected buffers; and wherein the scaling factor circuit comprises:
a plurality of flip flops, each having an input coupled to an output of a different one of the plurality of series connected buffers, and being clocked by a delayed version of the noisy feedback frequency signal;
a binary encoder receiving output from each of the plurality of flip flops and configured to calculate the number of delay elements of the delay chain needed to delay the noisy feedback frequency signal by a period of the PLL clock signal based upon the output from each of the plurality of flip flops, and to generate the scaling factor based upon the number divided by a number of bits in the frequency control word.

8. The PLL circuit of claim 7, further comprising a delay flip flop receiving the noisy feedback frequency signal as input, being clocked by the PLL clock signal, and generating the delayed version of the noisy feedback frequency signal as output.

9. The PLL circuit of claim 6, wherein the scaling factor circuit is activated to calculate the scaling factor once after phases of the reference frequency signal and the feedback frequency signal are matched.

10. The PLL circuit of claim 6, wherein the scaling factor circuit operates to continuously recalculate the scaling factor after phases of the reference frequency signal and the feedback frequency signal are matched.

11. The PLL circuit of claim 1, wherein the phase detector comprises a bang-bang phase detector.

12. The PLL circuit of claim 1, wherein the oscillator comprises a current controlled oscillator.

13. A method, comprising:
generating a digital signal indicative of a phase difference between a reference frequency signal and a feedback frequency signal;
filtering the digital signal;
converting the filtered digital signal to a control signal;
generating a PLL clock signal based on the control signal;
modulating a divider signal as a function of a frequency control word;
dividing the PLL clock signal based on the divider signal to generate a noisy feedback frequency signal based thereupon; and
removing quantization noise from the noisy feedback frequency signal to thereby generate the feedback frequency signal, the quantization noise being removed by:
generating a multiplexing control signal by:
quantizing an unshaped quantization error related to the quantization noise from a higher bit count to a lower bit count to produce a first intermediate signal,
applying a noise transfer function to the first intermediate signal to produce a second intermediate signal, and
integrating the second intermediate signal to produce the multiplexing control signal;
generating multiple different delayed versions of the noisy feedback frequency signal, and
passing one of multiple different delayed versions of the noisy feedback frequency signal as the feedback frequency signal in response to the multiplexing control signal.

14. The method of claim 13, further comprising multiplying the unshaped quantization error by a scaling factor prior to the quantizing.

15. The method of claim 14, wherein the scaling factor is determined by calculating a number of delay elements of a delay chain needed to delay the noisy feedback frequency signal by a period of the PLL clock signal, and to generate the scaling factor based upon the number.

16. A circuit, comprising:
a phase locked loop (PLL) circuit comprising a feedback loop, the feedback loop comprising:
a divider operating based upon a divider control signal;
a plurality of series connected buffers;
a multiplexer configured to select one output from the plurality of series connected buffers to generate a feedback signal for compensation based on a multiplexer control signal;
a control circuit configured to receive an unshaped quantization error in the divider control signal and to:
quantize the unshaped quantization error in the divider control signal to produce a first intermediate signal,
apply a noise transfer function to the first intermediate signal to produce a second intermediate signal, and
integrate the second intermediate signal to produce the multiplexer control signal.

17. The circuit of claim 16, wherein the control circuit multiplies the unshaped quantization error by a scaling factor prior to the quantizing.

18. The circuit of claim 17, wherein the divider produces a noisy feedback frequency signal for the PLL; and further comprising a scaling factor circuit configured to calculate a number of the plurality of series connected buffers needed to delay the noisy feedback frequency signal by a period of a PLL clock signal, and to generate the scaling factor based upon the number.

19. The circuit of claim 18, wherein one of multiple different delayed versions of the noisy feedback frequency signal is produced at an output of each of the plurality of series connected buffers.

20. The circuit of claim 19, wherein the scaling factor circuit comprises:
   a plurality of flip flops, each having an input coupled to an output of a different one of the plurality of series connected buffers, and being clocked by a delayed version of the noisy feedback frequency signal;
   a binary encoder receiving output from each of the plurality of flip flops and configured to calculate a number of the plurality of series connected buffers needed to delay the noisy feedback frequency signal by a period of the PLL clock signal based upon the output from each of the plurality of flip flops, and to generate the scaling factor based upon the number divided by a number of bits in a frequency control word used in generation of the divider control signal.

21. The circuit of claim 20, further comprising a delay flip flop receiving the noisy feedback frequency signal as input, being clocked by the PLL clock signal, and generating the delayed version of the noisy feedback frequency signal as output.

* * * * *